United States Patent
Kim

(10) Patent No.: US 9,075,711 B2
(45) Date of Patent: Jul. 7, 2015

(54) NON-VOLATILE MEMORY DEVICE USING DIVISION ADDRESSING AND ELECTRONIC DEVICE INCLUDING SAME

(71) Applicant: Jin-Hyun Kim, Yongin-si (KR)

(72) Inventor: Jin-Hyun Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 13/733,368

(22) Filed: Jan. 3, 2013

(65) Prior Publication Data

US 2013/0268722 A1  Oct. 10, 2013

(30) Foreign Application Priority Data

Apr. 9, 2012 (KR) .................. 10-2012-0036539

(51) Int. Cl.
  *G06F 12/02* (2006.01)
  *G11C 8/10* (2006.01)
  *G11C 8/12* (2006.01)
  *G11C 11/16* (2006.01)

(52) U.S. Cl.
  CPC .............. *G06F 12/0246* (2013.01); *G11C 8/10* (2013.01); *G11C 8/12* (2013.01); *G11C 11/16* (2013.01)

(58) Field of Classification Search
  CPC .............. G06F 12/0246; G06F 3/0679; G06F 2212/2022; G06F 2212/222; G06F 2212/7211; G11C 16/102
  USPC ................................... 711/103, 105
  See application file for complete search history.

(56) References Cited

U.S. PATENT DOCUMENTS

| | | |
|---|---|---|
| 7,042,797 B2 | 5/2006 | You |
| 7,154,775 B2 | 12/2006 | Shimizu et al. |
| 2001/0024399 A1 | 9/2001 | Woo et al. |
| 2002/0101760 A1 | 8/2002 | Naji |
| 2005/0204091 A1 | 9/2005 | Kilbuck et al. |
| 2008/0162768 A1* | 7/2008 | Klint et al. ............ 710/305 |
| 2009/0175115 A1 | 7/2009 | Bilger et al. |

* cited by examiner

*Primary Examiner* — Jasmine Song
(74) *Attorney, Agent, or Firm* — Volentine & Whitt, PLLC

(57) ABSTRACT

A non-volatile memory device uses division addressing scheme and N address input terminals. A address decoder of the non-volatile memory device simultaneously activates a row select signal and a column select signal by synchronizing a first N-bit address signal and a second N-bit address signal sequentially input after the first N-bit address signal.

19 Claims, 4 Drawing Sheets

NON-VOLATILE MEMORY DEVICE USING DIVISION ADDRESSING AND ELECTRONIC DEVICE INCLUDING SAME

CROSS-REFERENCE TO RELATED APPLICATION

This application claims priority under 35 USC §119 to Korean Patent Application No. 2012-0036539, filed on Apr. 9, 2012, the subject matter of which is hereby incorporated by reference.

BACKGROUND

The inventive concept relates generally to semiconductor memory devices. More particularly, the inventive concept relates certain non-volatile memory devices employing an address signal division methods that allow a reduced number of address signal terminals. The inventive concept also relates to electronic systems including this type of non-volatile memory device.

So-called, magnetic random access memory (MRAM) is generally characterized by high memory cell integration density similar to that of dynamic random access memory (DRAM). MRAM provides faster data access speeds than static random access memory (SRAM), and provide non-volatile data storage like flash memory. MRAM operates with lower power consumption than DRAM and SRAM.

However, since conventional MRAM employs current sensing to read and write data, both column and row addresses must be simultaneously applied during read/write operations. As a result, both N-bit row address terminals and M-bit column address terminals must be provided by MRAM to competently receive address signals during read/write operations. Assuming N and M are equal, 2N address terminals must be conventionally provided by MRAM. Unfortunately, as the number of address input terminals increases, the packaging costs associated with the constituent semiconductor memory device also increase. High packaging costs have been recognized as a major impediment to sought-for reductions in the overall production costs of MRAM.

In addition, conventional MRAM are not compatible with conventional DRAM in many ways, including data access signaling.

SUMMARY

Some example embodiments provide a non-volatile memory device capable of reducing the number of address input terminals.

Some example embodiments provide an electronic device including a non-volatile memory device compatible with DRAM interface.

In one embodiment, the inventive concept provides a non-volatile memory device comprising; a memory cell array of non-volatile memory cells, N address input terminals configured to receive an externally provide address signal, and an address decoder configured to simultaneously activate a row select signal and a column select signal to select a non-volatile memory cell in the memory cell array by synchronizing a first N-bit address signal received at the N address input terminals with a second N-bit address signal received at the N address input terminal after the first N-bit address signal.

In another embodiment, the inventive concept provides a memory system comprising; a memory controller configured to control a dynamic random access memory (DRAM) device and a non-volatile random access memory (NVRAM) device, such that during a DRAM control mode, the memory controller is configured to provide a N-bit address signal to the DRAM device during one of a DRAM read operation and a DRAM write operation via a N-bit wide address bus, and during a NVRAM control mode, the memory controller is further configured to provide a 2N-bit address signal to the NVRAM device using a division addressing scheme during one of a NVRAM read operation and a NVRAM write operation via the N-bit wide address bus.

In another embodiment, the inventive concept provides a method of operating a memory system including a memory controller configured to control a dynamic random access memory (DRAM) device and a non-volatile random access memory (NVRAM) device, the method comprising; receiving a data access command, and on the basis of the data access command entering one of a DRAM control mode and a NVRAM control mode, and during the DRAM control mode providing a N-bit address signal to the DRAM device from the memory controller via a N-bit wide address bus, else during the NVRAM control mode providing a 2N-bit address signal from the memory controller to the NVRAM device using a division addressing scheme via the N-bit wide address bus.

BRIEF DESCRIPTION OF THE DRAWINGS

The inventive concept may be more clearly understood upon consideration of certain embodiments set forth in the accompanying drawings.

DETAILED DESCRIPTION

Figure 1:
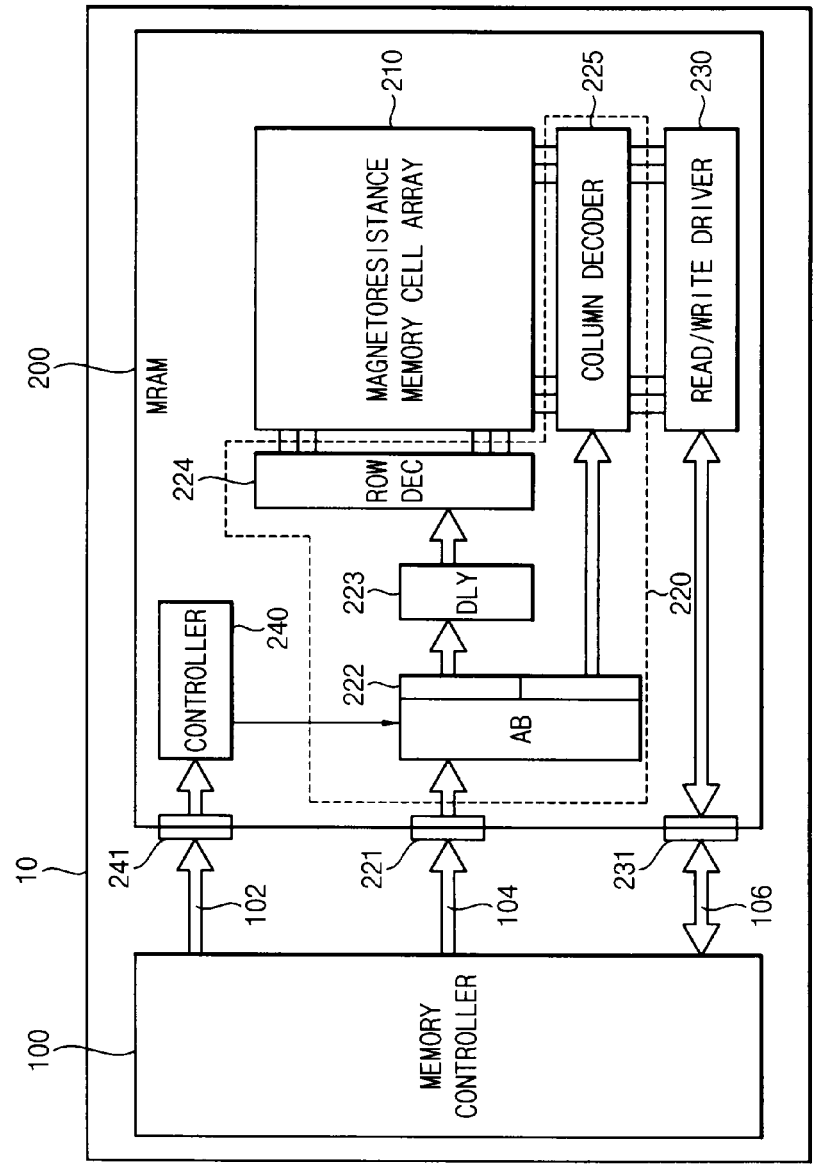
FIG. 1 is a block diagram illustrating an electronic device according to example embodiment of the inventive concept.

Certain embodiments of the inventive concept will now be described in some additional detail with reference to the accompanying drawings. The present inventive concept may, however, be embodied in many different forms and should not be construed as limited to only the illustrated embodiments. Rather, these example embodiments are provided so that this disclosure will be thorough and complete, and will fully convey the scope of the present inventive concept to those skilled in the art. Throughout the drawings and written description, like reference numbers and labels are used to denote like or similar elements, features and steps.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the inventive concept provide MRAM having a reduced number of address signal terminals. The reduction of required address signal terminals in MRAM according to embodiments of the inventive concept may be as high as 50%.

Embodiments of the inventive concept also remedy certain address signaling incompatibilities noted between conventional MRAM and DRAM/SRAM. As a result, multiple (differently-operated) buses need not be provided between a memory controller and connected MRAM and DRAM/SRAM in certain embodiments of the inventive concept. Accordingly, memory systems according to certain embodiments of the inventive concept may be provided with reduced bus complexity, as compared with conventional memory systems suffering from address signaling incompatibilities between MRAM and DRAM/SRAM.

FIG. 1 is a block diagram illustrating an electronic device 10 according to an embodiment of the inventive concept. The electronic device 10 may be (e.g.,) a computer system, a personal computer (PC), a laptop computer, a tablet computer, a smart phone, an MP3 player, a USB storage device, a smart card, a semiconductor memory storage device, a semiconductor memory module, or a multi-memory chip module including a magnetic random access memory (MRAM).

Referring to FIG. 1, the electronic device 10 generally comprises a memory controller 100 and an MRAM 200.

The memory controller 100 respectively applies control, address, and/or data (C/A/D) signals to the MRAM 200 via a control bus 102, an address bus 104, and a data bus 106. Since it is assumed that the illustrated embodiment employs a division addressing scheme, the address bus 104 is further assumed to have a N-bit width corresponding to half of the address bits usually applied to conventional MRAM. That is, in the illustrated embodiment of FIG. 1 it is assumed that a total of up to 2N address bits are applied to the MRAM during read/write operations, yet the address bus 104 is only N bits wide. It is further assumed that N-bit width of the address bus 104 is equal to the width of the address bus associated with an analogous DRAM.

The memory controller 100 may therefore employ a general DRAM access control scheme. In other words, the memory controller 100 may be configured to generate a column address signal simultaneously with an active command, and generate a row address signal simultaneously with a read/write command according to predetermined timing in order to designate (i.e., identify) a specific memory cell in a memory cell array 210 during read/write operations.

The MRAM 200 comprises the memory cell array 210, an address decoder 220, a read/write driver 230, and a controller 240. The memory cell array 210 includes a plurality of magneto-resistive memory cells arranged in a two-dimensional matrix of rows and columns. The magneto-resistive memory cells of the memory cell array 210 may include (e.g.) tunneling magneto-resistive (TMR) memory cells and/or giant magneto-resistive (GMR) memory cells. The rows of the memory cell array 210 are respectively arranged in relation to one of a plurality of word lines, and the columns of the MRAM device may be variously arranged in relation to a plurality of bit lines. Each magneto-resistive memory cell is typically located at an interconnection of word line and bit line.

A data layer of each (binary) magneto-resistive memory cell may be used to indicate a stored data value of '0' or '1' depending on its magnetization orientation relative to a reference layer. The characteristics related to a magnetized layer such as the data layer include coercivity, wherein "coercivity" may be understood as an amount of force necessary to maintain a particular magnetization orientation. In other words, in order to "flip" (or switch) the data layer from one logic state to another logic state (e.g., from '0' to '1' or from '1' to '0'), an external magnetic field greater than the coercivity of the data layer must be applied to the magneto-resistive memory cell.

For example, in order to switch a selected memory cell, an electrical current is applied to corresponding bit line and word line. In the selected memory cell, which is located at an intersection of the bit line and word line, a magnetic field is generated by the applied currents. When the generated magnetic field exceeds the coercivity threshold value of the magneto-resistive memory cell, the stored bit value flips. That is, the magnetization orientation of the data layer of the magneto-resistive memory cell changes.

MRAM must be designed to properly balance coercivity with applied currents to the bit line and word line. If the coercivity is too low, the magneto-resistive memory cell will be unstable, such that the generated magnetic field undesirably exceeds the coercivity threshold value due to temperature fluctuations. In such cases, the stored data value of the magneto-resistive memory cell may switch inadvertently. Thus, and "increase in coercivity" denotes an increase of the current applied to at least one of the bit line and word line.

In other words, in order to read data from the memory cell array 210 or write data to the memory cell array 210, it is necessary to provide timing synchronization by which at least portions of "active" current pulses flowing through both of the word line and bit line overlap is achieved.

In the illustrated embodiment of FIG. 1, the address decoder 220 includes an address buffer (AB) 222, a delay unit (DLY) 223, a row decoder (ROW DEC) 224, and a column decoder 225. The address buffer 222 may be configured to latch row address signals first applied through N address signal input terminals 221 in a row address buffer, and thereafter to latch column address signals later applied through the N address signal input terminals 221 in a column address buffer. The latched row address signals may then be sent to the row decoder 224 via the delay unit 223 for purposes of timing synchronization with the later-applied column address signals. In similar manner, the column address signals may be sent to the column decoder 225, except without the synchronizing delay.

Thereafter, a row select signal may be obtained by a row decoding operation performed by the row decoder 224, and a column select signal may be obtained by a column decoding operation performed by the column decoder 225. The row select signal and the column select signal are synchronized in order to be simultaneously (i.e., active periods overlapping at least in part) applied to a selected word line and a selected bit line of the memory cell array 210.

As the result of a read operation, the read/write driver 230 may be configured to receive "read data" via the selected bit line through the column decoder 225 and then output the read data to an external device through a plurality of input/output (I/O) terminals 231. As the result of a write operation, the read/write driver 230 receives externally provided "write data" through the I/O terminals 231 and then supplies the write data to the selected bit line through the column decoder 225.

The controller 240 may be configured to decode control signals (e.g., a chip enable single, a read/write enable signal, an output enable signal, etc.) received through a plurality of control signal terminals 241 and thereafter generate (e.g.,) command signal(s) provide to the address decoder 220 and read/write driver 230.

Figure 2:
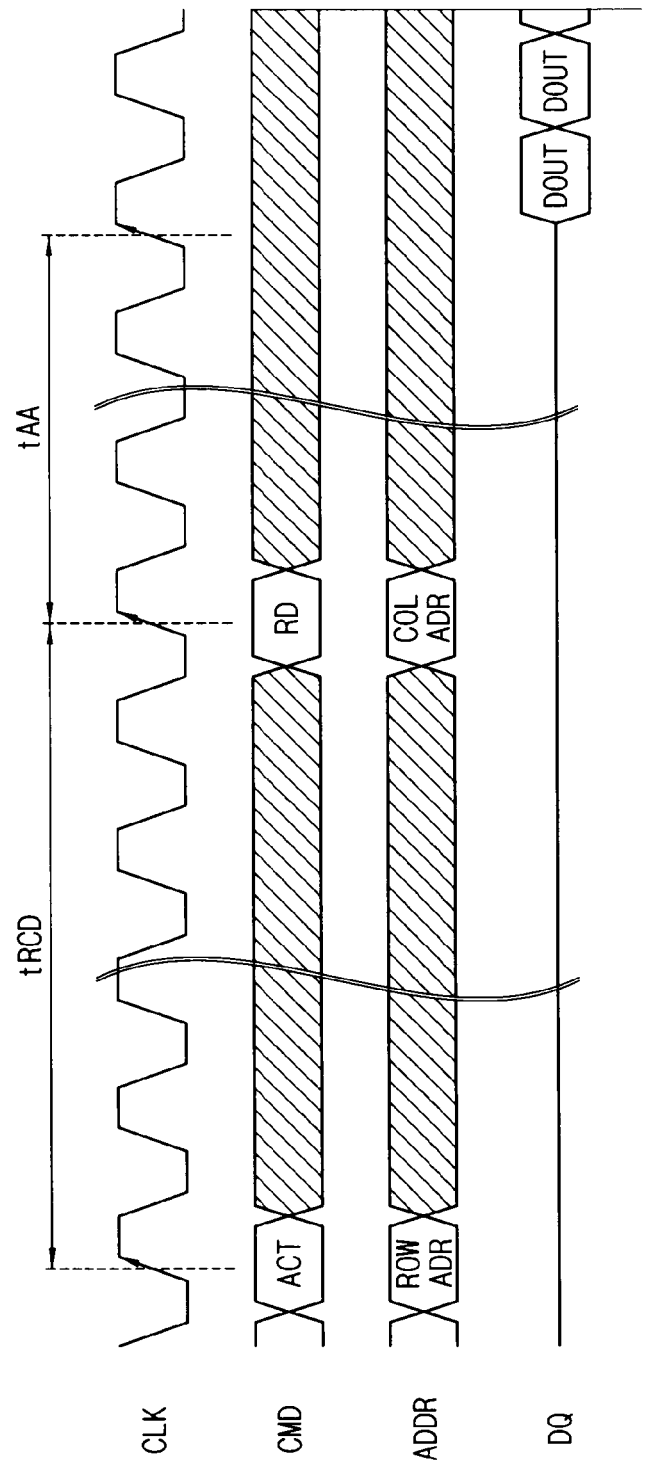
FIG. 2 is a timing diagram illustrating execution of a read operation in a conventional MRAM.

FIG. 2 is a timing diagram illustrating an exemplary read operation that may be executed according to a conventional MRAM.

Referring to FIG. 2, a row address signal (ROW ADR) received via an address bus is latched in an address input buffer upon the recognition of an active command signal (ACT) at a rising edge of a clock signal (CLK). The row address signal drives a selected word line through the row decoder 224. Therefore, the data stored by a magneto-resistive memory cell coupled to a selected word line is voltage-divided by the selected bit line. In other words, after a row/column delay time (tRCD) during which the word line remains selected, a column address (COL ADR) is latched in the address input buffer upon recognition of a read command signal (RD) at another rising edge of the clock signal (CLK). The column address signal selects a bit line through the column decoder and enables a sense-amplification operation to be performed. Accordingly, sense-amplified read data (DOUT) is applied to a data I/O line through the read driver. In other words, after a column address access time (tAA) has been elapsed, the read data (DOUT) applied to the data I/O line may be output to an external device through a data I/O terminal (DQ).

Figure 3:
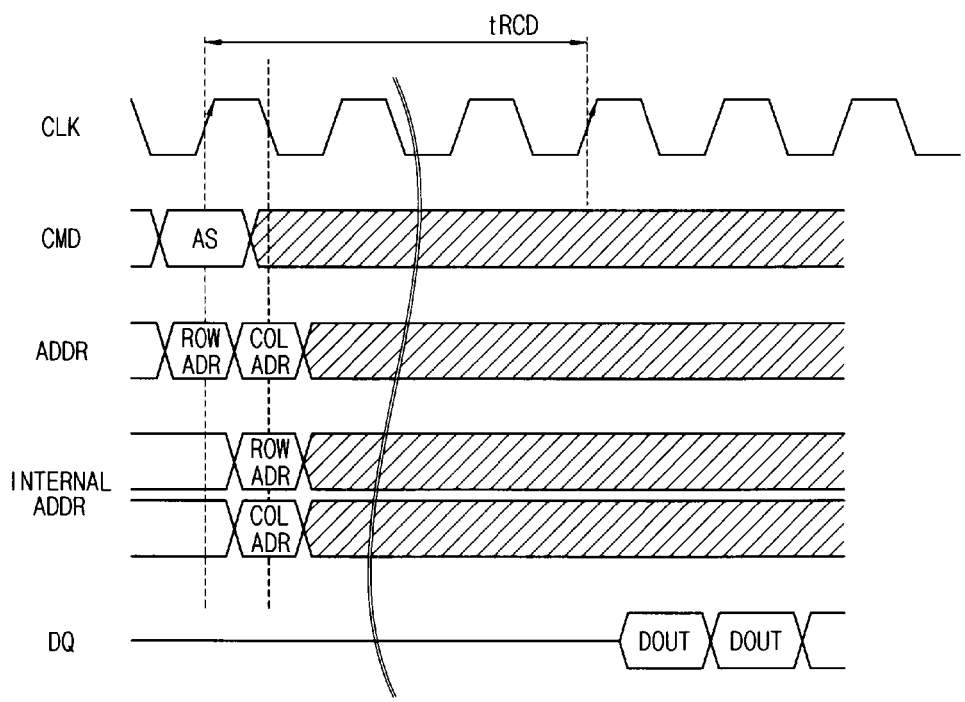
FIG. 3 is a timing diagram illustrating execution of a read operation in an MRAM using a division addressing access method according to an embodiment of the inventive concept.

By way of comparison, FIG. 3 is a timing diagram illustrating a read operation executed by a MRAM using a division addressing access scheme according to an embodiment of the inventive concept.

Referring to FIGS. 1 and 3, the memory controller 100 may be configured to set the row/column delay time to zero (tRCD=0), and generate an address strobe signal (AS) at the rising edge of the clock signal (CLK) during an MRAM access mode (or read operation). Simultaneously, the memory controller 100 may be configured to sequentially generate the row address signal (ROW ADR) and the column address signal (COL ADR) while setting a time difference (e.g.) equal to one-half the clock signal period.

In response, the MRAM 200 receives the address strobe signal AS at the rising edge of the clock signal. The controller 240 recognizes an address access command through a decoding operation in response to the address strobe signal AS, and simultaneously, controls the address buffer 232 to latch the row address signal (ROW ARD) as applied via the address bus in the row address buffer. After the row address signal (ROW ADR) has been latched in the row address buffer for one-half the clock signal period according to the delay unit 223, the row address signal (ROW ADR) may be sent to the row decoder 234. Simultaneously, the address buffer 232 may be configured to latch the column address signal (COL ARD) as applied via the address bus in the column address buffer at a falling edge of the clock signal. Then, the latched column address signal (COL ARD) may be directly sent to the column decoder 235 in a manner synchronous with the latched row address signal (ROW ADR).

Accordingly, as illustrated in FIG. 3, "internal address signals" for the MRAM 200 (as compared with the "external" address signal(s) provide by the memory controller 100) may be simultaneously (i.e., overlapping at least in part) applied to the row decoder 234 and column decoder 235 synchronously with (e.g.,) the falling edge of the clock signal. Since the address-designated word line and bit line are simultaneously and synchronously selected, an active duration of a word line current pulse will overlap with an active duration of a bit line current pulse, thereby "activating" the selected magneto-resistive memory cell. As a result, a bit line current passing through the activated magneto-resistive memory cell may be sense-amplified. The sensed read data may thereafter be applied to the data I/O line through the read driver. In other words, following the column address access time (tAA), the cell data (DOUT) applied to the data I/O line may be provided to an external device through the data I/O terminal (DQ).

As described above, according to certain embodiments of the inventive concept, the number of address input terminals may be reduced by up to 50% (e.g., from 2N to N). Further, data may be read from a MRAM according to certain embodiment of the inventive concept in as few as 3 clock cycles, while employing a simultaneous row/column addressing scheme analogous to those of conventional DRAMs.

Figure 4:
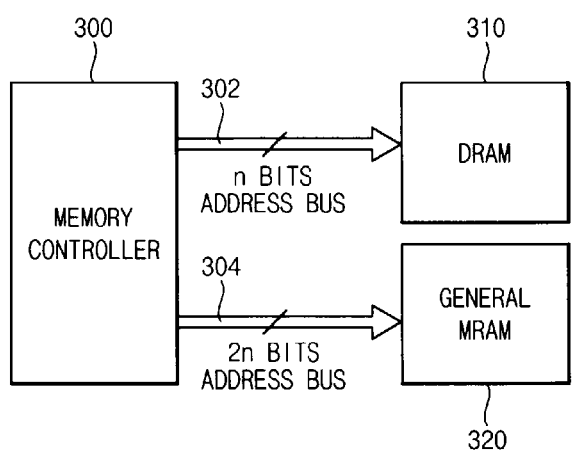
FIG. 4 is a block diagram illustrating an electronic device employing a conventional MRAM and a conventional DRAM.

FIG. 4 is a block diagram illustrating one example of an electronic device having a conventional memory system including both DRAM and MRAM.

Referring to FIG. 4, a memory controller 300 accesses data in a DRAM 310 through a N bit address bus 302, and accesses data in a MRAM 320 through a 2N bit address bus 304. Thus, the MRAM 320 requires 2N-bit address signaling while the DRAM 310 requires N bit address signaling. Hence, the different address buses 302 and 302 must be essentially dedicated to the respective operation of DRAM 310 and MRAM 320. This dual provision of buses 302 and 304 to access data from DRAM 310 and MRAM 320 requires a great deal of space on the printed circuit board mounting at least the DRAM 310 and MRAM 320. In addition, since the DRAM 310 and the MRAM 320 have different address bit configurations, the DRAM 310 and the MRAM 320 must be separately controlled by the memory controller 300, thereby expanding the computational load on the memory controller 300.

Figure 5:
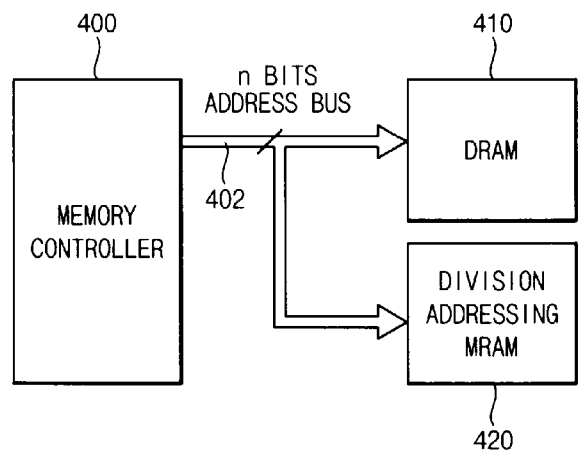
FIG. 5 is a block diagram generally illustrating an electronic device compatibly employing a conventional DRAM and a MRAM according to an embodiment of the inventive concept.

In contrast, FIG. 5 is a block diagram illustrating an electronic device employing a division addressing type MRAM 420 and a conventional DRAM 410 according to certain embodiments of the inventive concept.

Referring to FIG. 5, a memory controller 400 is commonly connected to the DRAM 410 and the division addressing type MRAM 420 via a N-bit address bus 402. Accordingly, even if both of the DRAM 410 and the division addressing type MRAM 420 are mounted on one circuit board, only one address bus 402 need be provided with respect to the DRAM 410 and the division addressing type MRAM 420.

Figure 6:
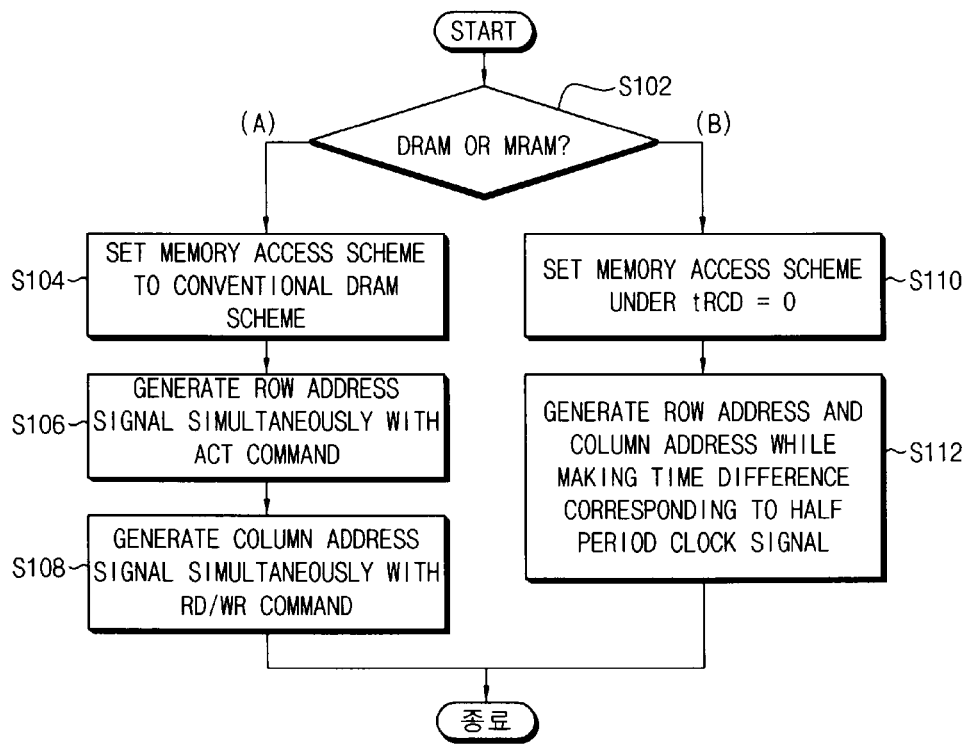
FIG. 6 is a flowchart summarizing one possible method of operating the electronic device of FIG. 5.

FIG. 6 is a flowchart summarizing one possible method of operating the electronic device of FIG. 5.

Referring to FIGS. 5 and 6, the memory controller 400 determines a present control mode by determining if a memory to be controlled is the DRAM 410 or MRAM 420 (S102). The memory controller 400 generates a chip enable signal enabling the selected memory chip according to this determination. During a DRAM control mode is selected (S102=A), a conventional memory access scheme is set for the DRAM 410 (S104). Thereafter, a row address signal is generated simultaneously with an ACT command (a low address strobe signal) (S106), and a column address signal is generated simultaneously with an RD/WR command (a column address strobe signal) (S108).

However, if a MRAM control mode is selected (S102=B), the memory access scheme is set under a condition in which the low column delay time tRCD is zero (tRCD=0) (S110). Thereafter, a row address signal is generated simultaneously with one address strobe signal obtained by integrating a row address strobe signal with a column address strobe signal. Consecutively, a column address signal is generated at the timing delayed by half a period of a clock signal (S112).

Although the present inventive concept is described regarding a current sensing non-volatile memory device by limiting the current sensing non-volatile memory device to an MRAM for convenience of description, it may be understood that a non-volatile memory device, such as a phase change random access memory (PRAM) or a resistive RAM (RRAM), including a resistance material can be addressed through a division addressing method similarly to the above embodiments only if the non-volatile memory device synchronously activates word and bit lines within the scope of the technical spirit of the example embodiments. In this context, the PRAM, RRAM and MRAM may be seen as different types of non-volatile random access memory devices (NVRAM).

In addition, although the present inventive concept is described in that a delay is interposed between an row address buffer and a row decoder, the delay may be located at various positions of delaying a row address signal by time, which is set to synchronize a row address to a column address, among predetermined positions on a path that the row address signal can be applied to a word line. For example, the delay may be located inside the row decoder or between a terminal of the row decoder and word lines.

In addition, although the present inventive concept is described regarding only the read operation for convenience of description, it may be understood that a division addressing method may be performed with respect to a write operation similarly to the above embodiments if word and bit lines can be synchronously activated. Such write operations fall within the scope of the inventive concept.

The illustrated embodiments of the inventive concept relate to technology capable of reducing the manufacturing cost of magnetic random access memory devices (MRAM), and are advantageously applicable to a low-cost MRAM product. In particular, the example embodiments are more advantageous when expanding application fields of the MRAM.

The foregoing is illustrative and should not be construed as limiting the scope of the inventive concept to only the illustrated embodiments. Although a few certain embodiments have been described, those skilled in the art will readily appreciate that many modifications are possible without materially departing from the novel teachings and advantages of the inventive concept. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A non-volatile memory device comprising:
a memory cell array of non-volatile memory cells;
N address input terminals configured to receive an externally provided address signal; and
an address decoder configured to simultaneously activate a row select signal and a column select signal to select a non-volatile memory cell in the memory cell array by synchronizing a first N-bit address signal received at the N address input terminals with a second N-bit address signal received at the N address input terminals after the first N-bit address signal,
wherein the address decoder comprises:
a row address buffer configured to latch the first N-bit address signal;
a delay unit configured to delay the first N-bit address signal from the row address buffer by a predetermined delay time to synchronize the first N-bit address signal with the second N-bit address signal;
a column address buffer configured to latch the second N-bit address signal;
a row decoder configured to generate the row select signal by decoding the first N-bit address signal from the delay unit; and
a column decoder configured to generate the column select signal by decoding the second N-bit address signal from the column address buffer.

2. The non-volatile memory device of claim 1, wherein the row select signal and the column select signal are simultaneously activated such that at least a portion of an active duration of the row select signal overlaps at least a portion of an active duration of the column select signal to activate the selected non-volatile memory cell.

3. The non-volatile memory device of claim 1, wherein an input time difference between receipt of the first N-bit address signal and receipt of the second N-bit address signal at the N address input terminals is equal to one-half a clock signal period.

4. The non-volatile memory device of claim 1, wherein the delay unit is configured to delay the first N-bit address signal by one-half a clock signal period.

5. The non-volatile memory device of claim 1, wherein the non-volatile memory cells are at least one of phase change random access memory (PRAM) cells, resistive random access memory (RRAM) cells and magneto-resistive random access memory (MRAM) cells.

6. A memory system comprising:
a memory controller configured to control a dynamic random access memory (DRAM) device and a non-volatile random access memory (NVRAM) device, such that
during a DRAM control mode, the memory controller is configured to provide a N-bit address signal to the DRAM device during one of a DRAM read operation and a DRAM write operation via a N-bit wide address bus, and
during a NVRAM control mode, the memory controller is further configured to provide a 2N-bit address signal to the NVRAM device using a division addressing scheme during one of a NVRAM read operation and a NVRAM write operation via the N-bit wide address bus.

7. The memory system of claim 6, wherein the 2N-bit address signal comprises a first N-bit address signal and a second N-bit address signal following the first N-bit address signal by a delay period.

8. The memory system of claim 7, wherein the NVRAM device comprises:
a memory cell array of non-volatile memory cells; and
an address decoder configured to simultaneously activate a row select signal defined by the first N-bit address signal and a column select signal defined by the second N-bit address signal, wherein the simultaneous activation of the row select signal and the column select signal is synchronous with a clock signal.

9. The memory system of claim 8, wherein the delay period is one-half a period of the clock signal.

10. The memory system of claim 8, wherein the address decoder comprises:
a row address buffer configured to latch the first N-bit address signal;
a delay unit configured to delay the first N-bit address signal from the row address buffer by the delay period;
a column address buffer configured to latch the second N-bit address signal;
a row decoder configured to generate the row select signal by decoding the first N-bit address signal from the delay unit; and
a column decoder configured to generate the column select signal by decoding the second N-bit address signal from the column address buffer.

11. The memory system of claim 8, wherein the NVRAM device is one of a phase change random access memory (PRAM) device, a resistive random access memory (RRAM) device and a magnetic random access memory (MRAM) device.

12. The memory system of claim 6, wherein the DRAM device and the NVRAM device have a same number of address input terminals.

13. The memory system of claim 7, wherein the first N-bit address signal is a row address signal and the second N-bit address signal is a column address signal.

14. A method of operating a memory system including a memory controller configured to control a dynamic random access memory (DRAM) device and a non-volatile random access memory (NVRAM) device, the method comprising:
receiving a data access command, and on the basis of the data access command entering one of a DRAM control mode and a NVRAM control mode; and
during the DRAM control mode providing a N-bit address signal to the DRAM device from the memory controller via a N-bit wide address bus, else during the NVRAM control mode providing a 2N-bit address signal from the memory controller to the NVRAM device using a division addressing scheme via the N-bit wide address bus.

15. The method of claim 14, wherein the 2N-bit address signal comprises a first N-bit address signal and a second N-bit address signal following the first N-bit address signal by a delay period.

16. The method of claim 15, further comprising:
during the DRAM control mode simultaneously activating a row select signal defined by the first N-bit address signal and a column select signal defined by the second N-bit address signal synchronously with a clock signal.

17. The method of claim 14, wherein the NVRAM device is one of a phase change random access memory (PRAM) device, a resistive random access memory (RRAM) device and a magneto-resistive random access memory (MRAM) device.

18. The method of claim 17, wherein the DRAM device and the NVRAM device have a same number of address input terminals.

19. The method of claim 17, wherein the first N-bit address signal is a row address signal and the second N-bit address signal is a column address signal.

* * * * *